United States Patent
Peng et al.

(10) Patent No.: US 10,508,872 B2
(45) Date of Patent: Dec. 17, 2019

(54) STREET LAMP WITH ENCHANCED HEAT DISSIPATION

(71) Applicants: LITE-ON ELECTRONICS (GUANGZHOU) LIMITED, Guangzhou (CN); LITE-ON TECHNOLOGY CORPORATION, Taipei (TW)

(72) Inventors: Yao-Chi Peng, Taipei (TW); Po-Chang Li, Taipei (TW); Ming-Hung Chien, Taipei (TW)

(73) Assignees: LITE-ON ELECTRONICS (GUANGZHOU) LIMITED, Guangzhou (CN); LITE-ON TECHNOLOGY CORPORATION, Taipei (TW)

(*) Notice: Subject to any disclaimer, the term of this patent is extended or adjusted under 35 U.S.C. 154(b) by 0 days.

(21) Appl. No.: 15/613,374

(22) Filed: Jun. 5, 2017

(65) Prior Publication Data
US 2018/0299213 A1  Oct. 18, 2018

(30) Foreign Application Priority Data
Apr. 13, 2017 (CN) .......................... 2017 1 0239473

(51) Int. Cl.
*F21V 29/70* (2015.01)
*F28F 13/18* (2006.01)
(Continued)

(52) U.S. Cl.
CPC ................ *F28F 13/18* (2013.01); *F21V 3/06* (2018.02); *H01L 33/60* (2013.01)

(58) Field of Classification Search
CPC ........ F21V 29/70; F21V 29/71; F21V 29/713; F21V 29/503; F21V 29/506; F21S 43/14;
(Continued)

(56) References Cited

U.S. PATENT DOCUMENTS 7,030,423 B2* 4/2006 Chang ................... H01L 33/486
257/100
7,434,959 B1* 10/2008 Wang ...................... F21S 2/005
362/218

(Continued)

FOREIGN PATENT DOCUMENTS

| KR | 20090068927 A | * | 6/2009 |
| KR | 1020090068927 A | | 6/2009 |
| TW | 200538767 | | 12/2005 |

OTHER PUBLICATIONS

Llew Edmunds, Application Note AN-1057, Heatsink Characteristics, International Rectifiers, Web Page, Apr. 1, 2016.*
(Continued)

*Primary Examiner* — Sean P Gramling
*Assistant Examiner* — Keith G. Delahoussaye
(74) *Attorney, Agent, or Firm* — McClure, Qualey & Rodack, LLP

(57) ABSTRACT

A light-emitting device including a lamp cover, a transparent front cover, a light-emitting element, a radiation layer and a reflective layer is provided. The transparent front cover and the lamp cover are combined together and form a cavity therein. The light-emitting element is disposed on the lamp cover and located within the cavity. The light-emitting element is used for emitting a light towards the transparent front cover. The radiation layer is formed on the lamp cover and the reflective layer is formed on the radiation layer.

10 Claims, 2 Drawing Sheets

(51) Int. Cl.
*H01L 33/60* (2010.01)
*F21V 3/06* (2018.01)

(58) Field of Classification Search
CPC .......... F21S 43/33; F21S 8/086; F21S 41/141;
F21S 41/143; F21S 41/151; F21S 41/153;
F21S 41/37; F21W 2131/103
USPC .................................................. 362/294, 545
See application file for complete search history.

(56) References Cited

U.S. PATENT DOCUMENTS

| | | | | |
|---|---|---|---|---|
| 7,922,372 B2* | 4/2011 | Li | ............................ | F21S 8/086 362/373 |
| 2004/0257827 A1* | 12/2004 | Ishida | ................... | F21S 41/147 362/545 |
| 2007/0070628 A1* | 3/2007 | Chen | ......................... | F21S 9/03 362/249.01 |
| 2007/0230191 A1* | 10/2007 | Komuro | .................... | F21V 7/22 362/341 |
| 2017/0254518 A1* | 9/2017 | Vasylyev | ............. | G02B 6/0068 |

OTHER PUBLICATIONS

TIPO Office Action dated Aug. 10, 2017 in Taiwan application (No. 106112311).

\* cited by examiner

STREET LAMP WITH ENCHANCED HEAT DISSIPATION

This application claims the benefit of People's Republic of China application Serial No. 201710239473.0, filed Apr. 13, 2017, the subject matter of which is incorporated herein by reference.

BACKGROUND OF THE INVENTION

Field of the Invention

The invention relates in general to a light-emitting device, and more particularly to a light-emitting device having a radiation layer.

Description of the Related Art

When conventional light-emitting devices emit a light, the heat will be inevitably generated. The larger the quantity of light-emitting elements is used, the larger the volume of heat will be generated. When the heat load received by the light-emitting device is too large, the light-emitting device will fail. Therefore, it has become a prominent task for the industry to provide a new type of light-emitting device capable of improving the heat dissipation efficiency.

SUMMARY OF THE INVENTION

The invention is directed to a light-emitting device capable of resolving the above problems.

According to one embodiment of the present invention, a light-emitting device is provided. The light-emitting device includes a lamp cover, a transparent front cover, a light-emitting element, a radiation layer and a reflective layer. The transparent front cover and the lamp cover are combined together and form a cavity therein. The light-emitting element is disposed on the lamp cover and located within the cavity. The light-emitting element is used for emitting a light towards the transparent front cover. The radiation layer is formed on the lamp cover and the reflective layer is formed on the radiation layer.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
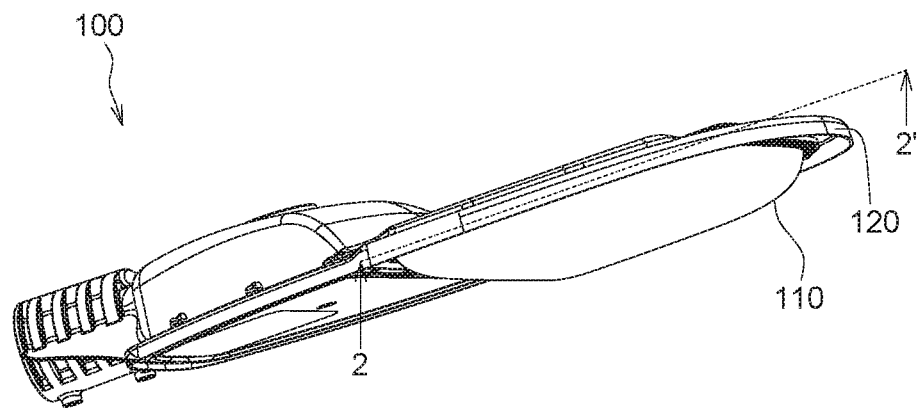
FIG. 1 is a schematic diagram of light-emitting device according to an embodiment of the invention.
Figure 2:
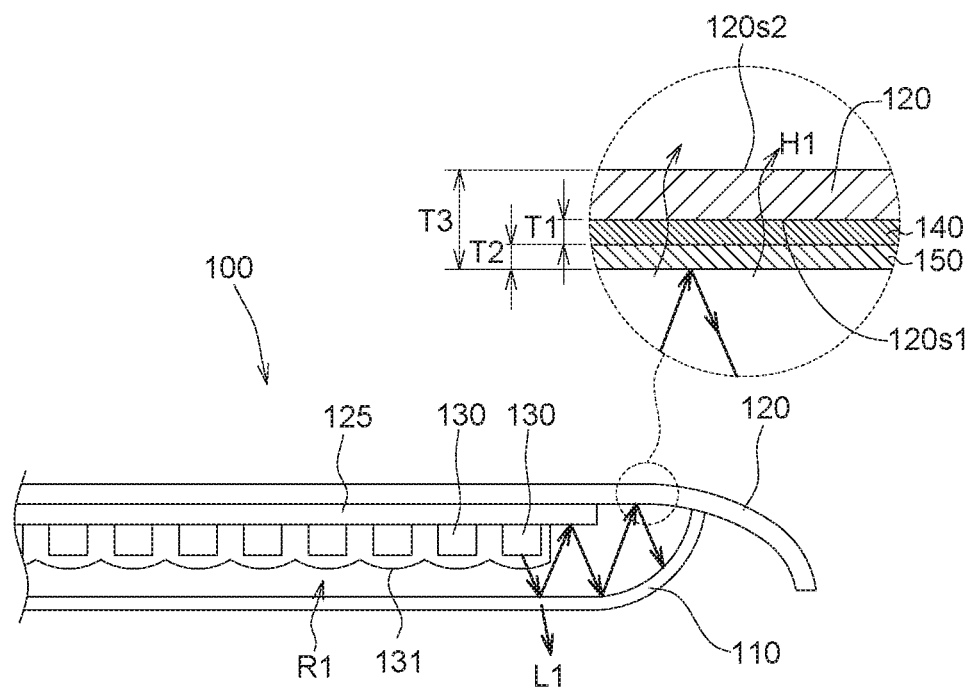
FIG. 2 is a partial cross-sectional view of the light-emitting device of FIG. 1 along the direction 2-2'.
Figure 3:
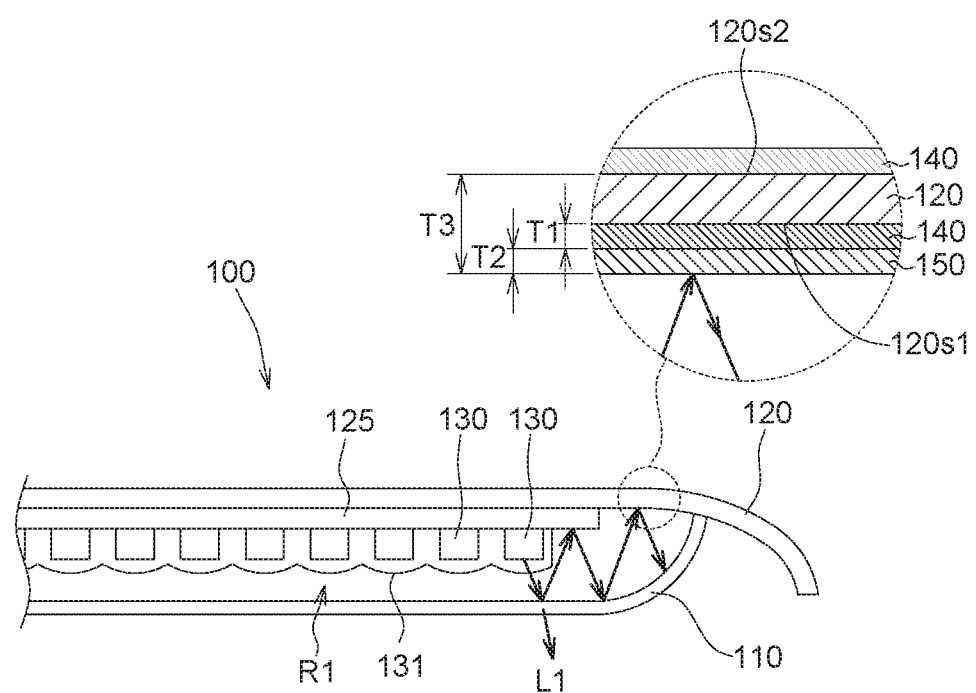
FIG. 3 is a partial cross-sectional view of the light-emitting device of FIG. 1 along the direction 2-2' in another embodiment of the invention.

Refer to FIGS. 1 and 2. FIG. 1 is a schematic diagram of a light-emitting device 100 according to an embodiment of the invention. FIG. 2 is a partial cross-sectional view of the light-emitting device 100 of FIG. 1 along the direction 2-2'.

The light-emitting device 100 can be used in street lamps or any other products that need illumination. The light-emitting device 100 includes a transparent front cover 110, a lamp cover 120, a circuit board 125, at least one light-emitting element 130, a radiation layer 140 and a reflective layer 150.

The transparent front cover 110 and the lamp cover 120 are combined together and a cavity R1 is formed therein. Although it is not illustrated in the diagrams, the transparent front cover 110 and the lamp cover 120 can be fixed with each other by way of engaging, locking or adhering, such that the cavity R1 formed between the transparent front cover 110 and the lamp cover 120 becomes an enclosed space for blocking the infiltration of external environmental factors such as liquid, moisture or impurities.

The circuit board 125 is disposed on the lamp cover 120. The light-emitting element 130 is disposed on the circuit board 125 and emits a light L1 towards the lens 131 and the transparent front cover 110, wherein the light L1 is such as a visible light. Through special design, the light L1, passing through the lens 131 and the transparent front cover 110, generates a predetermined illumination area. The circuit board 125, the light-emitting element 130 and the lens 131 are located within the cavity R1 and therefore are protected by the transparent front cover 110 and the lamp cover 120 from being damaged by the external environment. The lamp cover 120 can be realized by such as a die casting. The lamp cover 120 can be formed of a metal such as aluminum or other material having excellent property of heat dissipation and being capable of quickly convecting or radiating the heat H1 generated by the light-emitting element 130 to the external environment to enhance heat dissipation.

The radiation layer 140 is formed on the lamp cover 120. For example, the radiation layer 140 can be directly or indirectly formed on the part of the inner surface 120$s$1 of the lamp cover 120 covered by the cavity R1 by way of spraying. In another embodiment, the radiation layer 140 can further be formed on the part of the inner surface 120$s$1 of the lamp cover 120 not covered by the cavity R1, such as the outer surface 120$s$2 of the lamp cover 120 (shown in FIG. or the entire inner or outer surface of the lamp cover 120.

The radiation layer 140 can conduct the heat H1 within the cavity R1 to the lamp cover 120 to increase the heat dissipation efficiency of the light-emitting device 100. Due to the restriction of the cavity R1, the light L1 cyclically reflected within the cavity R1 will accumulate the heat H1 within the cavity R1 and increase the temperature of the light-emitting device 100. However, due to the design of the radiation layer 140 of the embodiments of the invention, the heat generated by the light-emitting element 130 can be quickly conducted to the lamp cover 120 through the radiation layer 140 and radiated to the external environment through the lamp cover 120. Since the radiation energy is comprised of the wavelength range of visible light or invisible light of the light L1, the heat dissipation efficiency of the light-emitting device 100 is increased. Therefore, the radiation layer 140 of the embodiments of the invention can be used as a heat conduction layer.

Since the heat dissipation efficiency of the light-emitting device 100 is increased, the light-emitting element 130 can be disposed within the enclosed cavity R1, and there is no need to make any openings on the lamp cover 120 or decrease the degree of sealing between the transparent front cover 110 and the lamp cover 120. In other words, although the light L1 emitted by the light-emitting element 130 inevitably will be cyclically reflected within the cavity R1, due to the design of the radiation layer 140, part of the radiation heat of the light L1 can be quickly conducted to the lamp cover 120 through the radiation layer 140 and radiated to the external environment through the lamp cover 120. In this way, the temperature change and pressure change within the cavity R1 will be reduced, and the degree of sealing between the transparent front cover 110 and the lamp cover 120 will not be decreased. If the temperature change within the cavity R1 is large, the pressure change will also be large, and the degree of sealing between the transparent front cover 110 and the lamp cover 120 will be decreased.

In an embodiment, the heat radiation efficiency of the lamp cover 120 is smaller than the heat radiation efficiency of the radiation layer 140. Since the heat radiation efficiency of the radiation layer 140 is superior, the overall heat dissipation efficiency of the light-emitting device 100 can be increased by using the radiation layer 140 although the heat radiation efficiency of the lamp cover 120 is inferior. In an embodiment, the heat radiation efficiency of the radiation layer 140 is greater than 0.9, and the heat radiation efficiency of the lamp cover 120 is about 0.4.

In an embodiment, the sum of the thickness T1 of the radiation layer 140 and the thickness T2 of the reflective layer 150 ranges between 60 and 200 microns (μm). The radiation layer 140 of the embodiments of the invention can quickly conduct the heat H1 to the lamp cover 120. In comparison to the design which dispenses with the radiation layer 140 and the reflective layer 150, the light-emitting device 100 of the embodiments of the invention including the radiation layer 140 and the reflective layer 150 achieves better heat dissipation efficiency but has a larger thickness T3. Experimental data shows that the heat dissipation efficiency of the light-emitting device 100 is increased by 3%.

Since the heat dissipation efficiency of the light-emitting device 100 of the embodiments of the invention is effectively increased, the heat dissipation efficiency still can be maintained even when a larger quantity of light-emitting elements 130 is used. In an embodiment, 12 light-emitting elements 130 are used.

The reflective layer 150 is formed on the radiation layer 140, wherein the radiation layer 140 is interposed between the reflective layer 150 and the lamp cover 120. The reflective layer 150 reflects the light L1 cycled within the cavity R1, and increases the intensity of the light emitted by the light-emitting device 100. Due to the design of the radiation layer 140, the reflective layer 150 has a high reflectivity. The reflective layer 150 with high reflectivity increases the recycling efficiency of the light emitted by the light-emitting element 130 and cycled within the cavity R1, and reduces the heat H1 accumulated within the cavity R1. However, through the design of the radiation layer 140, the accumulated heat H1 is quickly conducted to the lamp cover 120, and convected or radiated to the external environment through the lamp cover 120. In an embodiment, the reflectivity of the reflective layer 150 can be larger than 85%. Besides, the material of the reflective layer 150 may include titanium oxide or zinc oxide. The weight percentage of titanium oxide or zinc oxide ranges between 0.5% and 15%.

The reflective layer 150 can be directly or indirectly formed on the radiation layer 140 by way of spraying (such as lacquer painting). Since the reflective layer 150 and the radiation layer 140 are separately formed, the radiation layer 140 and the reflective layer 150 are two different layers and are separated by a significant interface. In another embodiment, depending on the materials and/or manufacturing processes of the reflective layer 150 and the radiation layer 140, the interface between the radiation layer 140 and the reflective layer 150 may be insignificant or difficult to recognize.

Through the design of the radiation layer 140 and the reflective layer 150, the light L1, having been reflected by the reflective layer 150, is outputted through the transparent front cover 110, the generated heat H1 can be conducted to the lamp cover 120 through the radiation layer 140, and the overall optical efficiency of the light-emitting device 100 of the embodiments of the invention can reach 95%.

While the invention has been described by way of example and in of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light-emitting device, comprising:
   a lamp cover;
   a transparent front cover combined with the lamp cover, wherein there is a cavity between the transparent front cover and the lamp cover;
   a circuit board directly disposed on an inner surface of the lamp cover and located within the cavity;
   a plurality of light-emitting elements disposed on the circuit board and located within the cavity, wherein lights emitted by the plurality of light-emitting elements are outputted through the transparent front cover;
   a single lens covering every light-emitting element and located within the cavity;
   a radiation layer formed next to the circuit board and directly formed on the inner surface of the lamp cover covered by the cavity; and
   a reflective layer directly formed on the radiation layer, wherein the radiation layer is further formed on an outer surface of the lamp cover.

2. The light-emitting device according to claim 1, wherein a heat radiation efficiency of the lamp cover is smaller than a heat radiation efficiency of the radiation layer.

3. The light-emitting device according to claim 1, wherein a surface of the single lens has a series of convex portions and each convex portion is corresponding to the position of one light-emitting element.

4. The light-emitting device according to claim 1, wherein a reflectivity of the reflective layer is larger than 85%.

5. The light-emitting device according to claim 1, wherein the reflective layer is made of a material comprising titanium oxide or zinc oxide.

6. The light-emitting device according to claim 5, wherein a weight percentage of the titanium oxide or a weight percentage of zinc oxide ranges between 0.5% and 15%.

7. The light-emitting device according to claim 1, wherein the radiation layer and the reflective layer are separated by an interface.

8. The light-emitting device according to claim 1, wherein the radiation layer and the reflective layer are two different layers.

9. The light-emitting device according to claim 1, wherein the sum of the thickness of the radiation layer and the thickness of the reflective layer ranges between 60 and 200 μm.

10. A light-emitting device, comprising:
    a lamp cover;
    a transparent front cover combined with the lamp cover, wherein there is a cavity between the transparent front cover and the lamp cover;
    a circuit board directly disposed on an inner surface of the lamp cover and located within the cavity;

a plurality of light-emitting elements disposed on the circuit board and located within the cavity, wherein lights emitted by the plurality of light-emitting elements are outputted through the transparent front cover;
a single lens covering every light-emitting element and located within the cavity;
a radiation layer formed next to the circuit board and directly formed on the inner surface of the lamp cover covered by the cavity; and
a reflective layer directly formed on the radiation layer, wherein the radiation layer is further formed on the inner surface of the lamp cover not covered by the cavity.

* * * * *